US010755891B2

(12) United States Patent
Gorman (10) Patent No.: US 10,755,891 B2
(45) Date of Patent: Aug. 25, 2020

(54) SYSTEMS AND METHODS OF ABERRATION CORRECTION FOR ATOM PROBE TOMOGRAPHY

(71) Applicant: Brian P. Gorman, Golden, CO (US)

(72) Inventor: Brian P. Gorman, Golden, CO (US)

(73) Assignee: COLORADO SCHOOL OF MINES, Golden, CO (US)

( * ) Notice: Subject to any disclaimer, the term of this patent is extended or adjusted under 35 U.S.C. 154(b) by 0 days.

(21) Appl. No.: 16/384,427

(22) Filed: Apr. 15, 2019

(65) Prior Publication Data

US 2019/0318907 A1    Oct. 17, 2019

Related U.S. Application Data

(60) Provisional application No. 62/657,718, filed on Apr. 13, 2018.

(51) Int. Cl.
*H01J 37/153* (2006.01)
*H01J 37/26* (2006.01)
*H01J 37/20* (2006.01)

(52) U.S. Cl.
CPC .......... *H01J 37/153* (2013.01); *H01J 37/20* (2013.01); *H01J 37/26* (2013.01); *H01J 2237/1534* (2013.01)

(58) Field of Classification Search
USPC ...................................... 250/288
See application file for complete search history.

(56) References Cited

U.S. PATENT DOCUMENTS

| 5,654,547 A * | 8/1997 | Coene | G03F 7/705 250/311 |
| 6,448,556 B1 * | 9/2002 | Cowley | H01J 37/12 250/311 |
| 8,670,608 B2 * | 3/2014 | Kelly | B82Y 15/00 382/131 |
| 9,412,558 B2 * | 8/2016 | Van Dyck | H01J 37/26 |
| 9,899,197 B2 * | 2/2018 | Sanford | H01J 49/0059 |
| 10,319,558 B2 * | 6/2019 | Sasaki | H01J 37/147 |

OTHER PUBLICATIONS

Haider et al., "A spherical-aberration-corrected 200 kV transmission electron microscope," Ultramicroscopy, vol. 75, 1998, pp. 53-60.

* cited by examiner

*Primary Examiner* — Phillip A Johnston
(74) *Attorney, Agent, or Firm* — Sheridan Ross, P.C.

(57) ABSTRACT

Methods and systems for correcting aberrations in atom probe tomography are described. A specimen function associated with a plurality of lattice positions of ions of a specimen in a holder is generated using a transmission electron microscope. An image function associated with x- and y-coordinates and time of flight information for a plurality of ions of the specimen in the holder is generated using a delay line detector mounted on the transmission electron microscope. A transfer function based on the specimen function and the image function is generated. The transfer function comprises information relating to ion trajectory aberrations. An Atom Probe Tomography (APT) image of the specimen is generated based on the specimen function, the image function, and the transfer function. The APT image is adjusted to correct for the ion trajectory aberrations.

20 Claims, 4 Drawing Sheets

Fig. 1

*PRIOR ART*

SYSTEMS AND METHODS OF ABERRATION CORRECTION FOR ATOM PROBE TOMOGRAPHY

RELATED APPLICATIONS

This application claims the benefit of U.S. Provisional Patent Application No. 62/657,718, filed Apr. 13, 2018, entitled "ABERRATION CORRECTION FOR ATOM PROBE TOMOGRAPHY," which is incorporated herein by reference in its entirety.

TECHNICAL FIELD

The present disclosure is generally related to methods of atom probe tomography and more particularly to an aberration correction method and apparatus utilized in atom probe tomography to obtain reconstructions with near lattice resolution in three-dimensions without a-priori knowledge of the specimen material and properties.

BACKGROUND

For over half a century, a goal of materials characterization has been measuring impurity elements with high detection and atomic spatial resolution. Conventionally, a full understanding of materials issues such as dopant distributions, compositional uniformity, interface abruptness, grain boundary structure, impurity segregation, etc., is required to advance the technology of most materials to achieve the optimum performance.

Conventional methods of transmission electron microscopy ("TEM") and scanning transmission electron microscopy ("STEM") can provide two-dimensional sub-A structural information in thin specimens, but low-level chemical sensitivity from energy dispersive X-ray ("EDS") and electron energy loss spectroscopy ("EELS") is lacking and generally limited to approximately one percent. Secondary ion mass spectrometry ("SIMS") is a proven technique for sampling one-dimensional low dopant levels (for example less than one ppm). Unfortunately, due to limitations in the spot size of the primary (sputtering) ion beam, spatial resolution with such systems is limited in the plane of the sample. Perpendicular to the sample (sputtering direction), the spatial resolution is greatly limited by forward scattering of the primary ion beam. When attempting to obtain low-level chemical information from nanostructures in electronic and optoelectronic materials, characterization techniques currently in use are fairly limited.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DESCRIPTION OF EMBODIMENTS

Using conventional systems, TEM images can be used to define the volume of a specimen assist in a limited way with confining some of the assumptions and variables required for conventional reconstruction methods. Using a reconstruction method as disclosed herein, however, the specimen volume and specimen function may be well resolved, and no assumptions associated with conventional reconstruction methods are needed. Instead, atoms are placed directly back onto the specimen function after their aberrations are corrected via the transfer function. The result is a highly simplified reconstruction method with greatly improved spatial accuracy and resolution.

To close the loop between experimental processing, atomic structure, property relationships, and first principles theory, atomic scale tomography ("AST") must become a reality. The present disclosure provides a way to realize AST. Quantitative determination of atomic locations and identities in 3-D at lattice resolution as described herein allows for direct feedback between experiment and theory and enables further developments in predicting properties of materials. AST requires both high spatial resolution (sub-nm) and simultaneously high chemical resolution (single atom sensitivity). The present disclosure describes several new techniques including in situ electron microscopy imaging of atom probe specimens, wide field of view ion detector integration for atom probe tomography ("APT"), and three-dimensional data reconstruction algorithms which overcome many of the limitations of conventional atom probe data analysis. Such techniques enable atomic scale research in virtually all inorganic materials science fields. For example, the ability to map atoms in three dimensions with lattice resolution and the applicability of the methods disclosed to virtually all inorganic materials systems enable rapid materials development in applications ranging from energy to structural materials. Accordingly, a method for correcting aberrations in Atom Probe Tomography is provided. The method may include detecting a plurality of ions, determining an ion trajectory aberration for each ion of the plurality of ions, correcting an ion trajectory associated with each ion of the plurality of ions based on the determined ion trajectory aberration for each ion of the plurality of ions, and generating an atom probe tomography ("APT") data reconstruction of the analyzed specimen.

Atom probe tomography ("APT") is a technique complementary to both transmission electron microscopy and secondary ion mass spectrometry. APT uses position-sensitive time-of-flight mass spectrometry on a needle-shaped specimen to develop a three-dimensional reconstruction of the atomic structure of the specimen.

Figure 1:
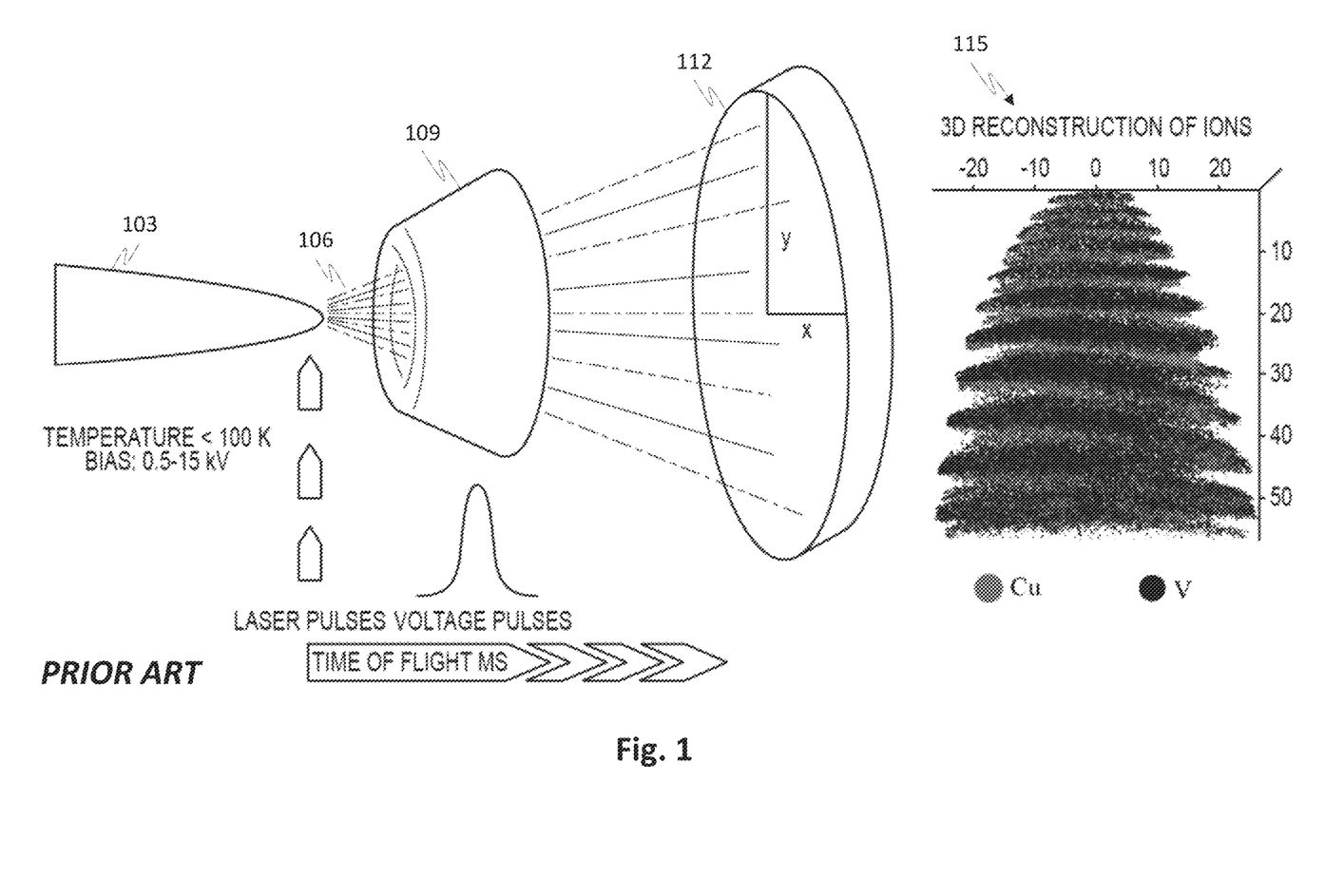
FIG. 1 illustrates a conventional system for generating atom probe tomography.

A conventional method of using APT is illustrated in FIG. 1. As illustrated, a needle-shaped, or otherwise sharp specimen 103 may be analyzed using APT. The specimen 103 may, for example, be of around one hundred nanometers in diameter. A high voltage may be applied to the specimen 103. One or more of lasers and a voltage may be pulsed at the specimen 103. The pulses may result in an increase in field and/or temperature combination. The field and/or temperature combination may be high enough to field evaporate ions 106 from a surface of the specimen. The ions 106 may pass through a local electrode 109 and arrive at a detector 112. The detector 112 may in some embodiments be a circular shape and a coordinate system (e.g. x- and y-axes) may be used to determine a location of each of the received ions 106. A timer may be used to determine a time of flight of the ions 106. The time of flight of the ions 106 may be measured for example in milliseconds. APT may result in a three-dimensional reconstruction 115 as illustrated.

Conventionally, atom probe tomography involves an alternating-current electric field (typically greater than two kilovolts). This is known as voltage pulsing. The AC electric filed may be placed on a needle-shaped tip of a specimen. The tip of the specimen may be of a radius of less than one hundred nanometers. Due to field enhancement effects on such a small geometry, surface atoms on the tip of the specimen gain enough energy to overcome an activation energy barrier for field emission from the surface of the specimen.

Atoms evaporated from the specimen may be detected by their time of flight on a two-dimensional microchannel plate backed by a delay line. Resulting signals may give information about the atoms' mass-to-charge ratio (for example less than one Da full width tenth maximum ("FWTM")) and detector position in two dimensions. Subsequently, evaporating the next layer of atoms from the surface of the specimen allows for three-dimensional reconstructions of the structure to be obtained. Typical spatial resolutions of such reconstructions may be greater than five Å in x- and y-axes, and potentially better than five Å in a z-axis. The resolution may depend heavily upon the specimen and reconstruction methods. Chemical concentrations down to around $10^{18}/cm^3$ can be achieved, dependent upon the experimental specimen-to-detector distance as well as the number of atoms collected.

Advances in atom probe instrumentation have greatly increased the volume of material analysed by atom probes, as well as expanded the applicability of atom probes to materials other than electronic conductors. This change in experimental geometry increases the field of view, decreases the voltage needed for ion evaporation, and increases the attainable evaporation rate. Specimen preparation with focused ion beam ("FIB") techniques and in situ liftout may be used in a number of situations, especially with respect to site-specific analyses. Due to the complementary data acquired from TEM and APT, specimen preparation techniques and hardware that allow specimens to be examined in both the TEM and APT may be created as described herein.

Conventional APT reconstruction methodologies most commonly employed by researchers are based upon those proposed by Bas. In such methodologies, ions are assumed to follow a trajectory perpendicular to the curved surface and follow a straight flight path to the detector. Under this assumption, ions are back-projected onto a curved surface and their positions given in three-dimensions by their position on the detector and the sequence by which they evaporated. The radius of curvature (R) of the specimen is assumed from $E=V/(k_f*R)$ where E is the evaporation field of the ions, V is the applied voltage, and $k_f$ is a factor dependent upon the specimen geometry. Assumptions relied upon in such reconstruction methodologies limit the spatial resolution of APT.

Additionally, an assumption that the evaporation field for a pure metal specimen at zero degrees Kelvin is the same as under laser pulsing conditions is incorrect. Every material has a temperature-dependence of evaporation field and as such the specimen temperature and E(T) must be known in order to accurately determine the specimen R and volume analyzed. For example, assuming that Cd metal and CdTe have the same evaporation field simply because they both contain Cd is incorrect due to a very different local bonding environment.

Such reconstruction methodologies also assume a homogeneous material throughout its length. If a material with a different E(T) is encountered, the reconstruction algorithm changes the volume incorrectly. Thus, APT is limited where it is potentially most useful—at heterojunction interfaces.

Ion trajectories are not always normal to the surface of the specimen, as is assumed by the Bas method. Local changes in crystallography, dielectric constant, and E(T) can affect the ion trajectories, resulting in data reconstruction spatial inaccuracies.

A reconstruction algorithm utilizing TEM real space information to confine the reconstruction process may be implemented using pre- and post-APT TEM imaging to define a field evaporated volume. Prior to this invention, ion aberrations could not be quantified sufficiently due to a lack of spatial resolution when defining the specimen shape.

In the systems and methods described herein, ion trajectory aberrations may be corrected during the reconstruction, or image forming process. Aberrations may be quantified through a process involving comparisons of a known specimen with an image produced after the lenses. Specifically, an image function, I(u) (for example, represented in Fourier space), is a convolution of the specimen function, S(u), with a lens aberration transfer function, H(u), explicitly: $I(u)=S(u)*H(u)$. H(u) is a convolution of several factors that can be mathematically isolated in Fourier space.

In accordance with embodiments of the present disclosure, a system of aberration-corrected APT ("AC-APT") is implemented to resolve ion aberration issues during the reconstruction process instead of using in-column hardware to correct for aberrations, as is done in TEM solutions. In some embodiments as described herein, a known specimen function, S(u), may act as a lens for field evaporated ions. The detected ions make up the image function, I(u), which has Fourier components containing information about the specimen and the ion trajectory aberrations, H(u). If S(u) is known in three-dimensions with adequate spatial resolution (for example around or less than 0.25 nm) and I(u) has the necessary magnification to obtain lattice resolution and captures the entire evaporated field of view, then H(u) can be quantified for every detected ion. Ion trajectories are subsequently corrected back to a normal incidence evaporation in Fourier space. Geometric models then handle the corrected data reconstruction. Comparing the Bas method for APT data reconstruction with the proposed AC-APT methodology a greatly simplified, more efficient system with improved resolutions is possible.

For example, as illustrated in Table 1, below, the many estimates and assumptions relied upon in the Bas method are either not needed or directly calculated or measured using the systems described herein.

| Variables | Bas Method | AC-APT |
|---|---|---|
| R; Specimen volume; ion size | From $E(T) = V/(k_f*R)$; estimated | Quantified with high resolution electron imaging |
| E(T) | Estimated from calculations of pure metals at 0 K only | Not needed |
| Specimen Temperature | Estimated | Not needed |
| $k_f$ | Semi-constant from L/r | Not needed |
| ICF, z | Estimated from estimated r | Calculated directly for all ions |
| Detector efficiency | Estimated from | Calculated directly |

-continued

| Variables | Bas Method | AC-APT |
|---|---|---|
| Sphere to cone ratio | reconstruction Estimated from reconstruction | Directly measured, not needed |
| Take off angle | Estimated | Directly measured |
| Ion Trajectory Aberrations | Difficult to correct | Corrected |

In some embodiments, if a spatial resolution better than ~0.25 nm is achieved for S(u) using the systems as described herein, true ion trajectory aberration correction can be achieved during the image reconstruction process.

In summary, and in accordance with embodiments of the present disclosure, APT reconstruction methodologies utilizing electron microscopy to define S(u) and large field of view ion detector to acquire accurate I(u) information allow for the calculation of H(u), including ion trajectory aberrations. Correcting the data for H(u) produces reconstructions with near lattice resolution in three-dimensions without cumbersome a-priori knowledge of the specimen material and properties using a reasonably simple, efficient, and cost-effective hardware solution.

Figure 2:
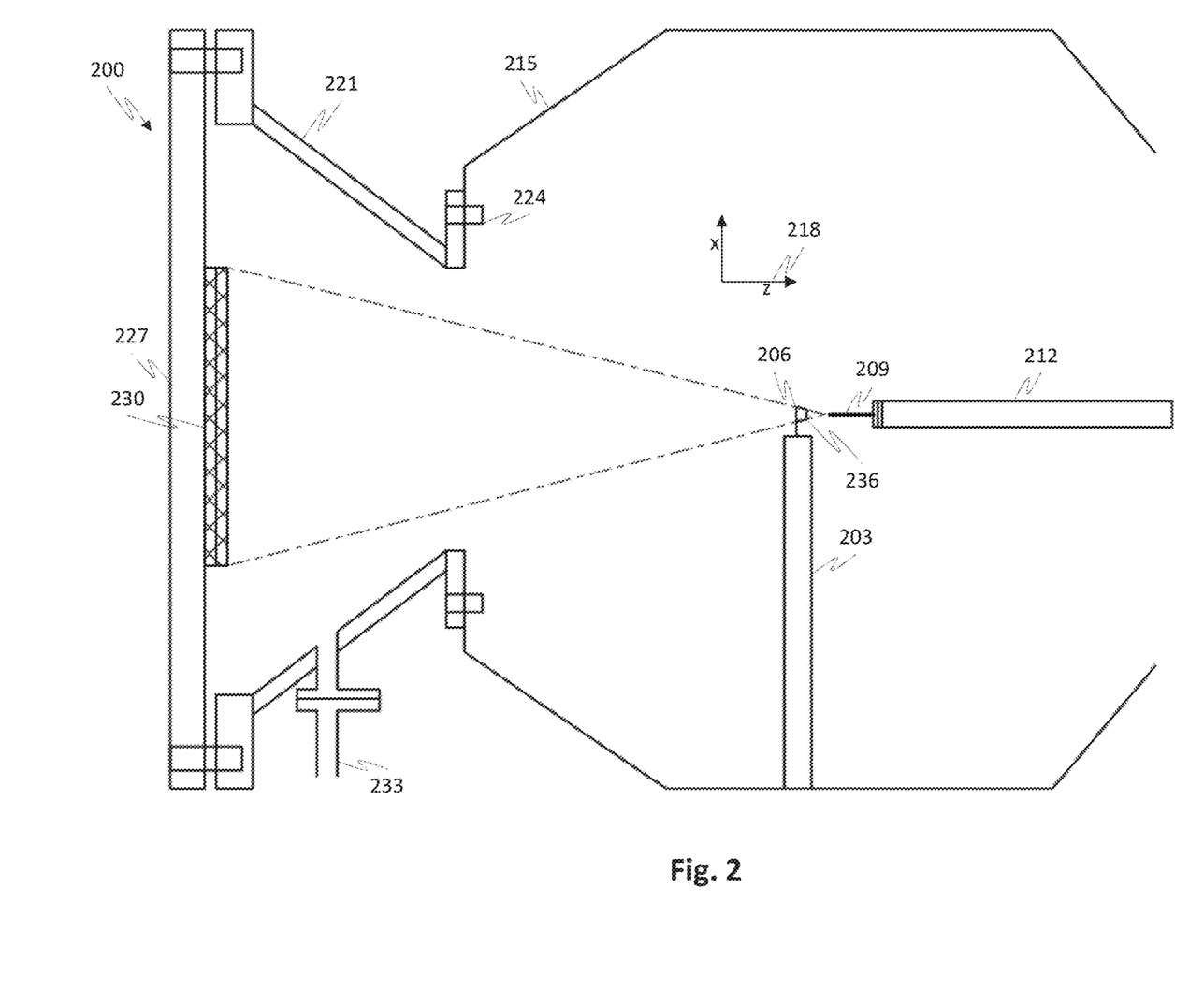
FIG. 2 illustrates an aberration-corrected atom probe tomography system in accordance with one or more of the embodiments described herein.

As illustrated in FIG. 2, a system 200 may be capable of generating both an image function and a specimen function of a specimen in a holder and an image function of the specimen. The system 200 may in some embodiments comprise hardware allowing for images to be taken of a specimen allowing for quarter-nano-meter (0.25 nm) spatial resolution during an atom probe experiment. The high spatial resolution achieved using a system 200 as illustrated in FIG. 2 enables aberration correction during image reconstruction.

The system 200 may comprise an objective aperture assembly 203. The objective aperture assembly 203 may be turned at a ninety-degree angle from where objective aperture assemblies are typically positioned in a conventional TEM. In this way, an end of the objective aperture assembly 203 may function as an ion extraction electrode 206. In some embodiments, a negative voltage may be applied to the objective aperture assembly 203 to create a bias between the local electrode 206 and the specimen 209.

The system 200 may further include a specimen holder 212. The specimen holder 212 may be capable of supporting a needle-shaped specimen 209. The specimen holder 212 may further be capable of applying a cryogenic temperature to the specimen. In some embodiments the specimen holder 212 may comprise a high-voltage feedthrough enabling a high-voltage to be applied to the specimen 209 directly from the holder 212.

Components of the system 200 may be contained within a TEM column 215. The system 200 may comprise TEM hardware. For example, the specimen 209 may be imaged using a TEM. The TEM may emit a beam of electrons through the specimen in a y-direction, where the y direction is perpendicular to a plane laying in the x and z directions shown by the coordinates 218. The TEM may be capable of generating an image of the specimen 209 which may be used to create a specimen function. In this way, the system 200 may be capable of generating both TEM data and detector data which may be used to generate the transfer function, where the transfer function is a convolution of factors relating to ion aberrations in the detector data. In some embodiments, the transfer function may be generated using a processor of a computer system. For example, a software means of comparing the specimen function with the image function may be created and executed using a processor.

The system 200 may further comprise a detector assembly 221. In some embodiments the detector assembly may be mounted to the TEM column via a mounting element 224. The detector assembly 221 may comprise a flange 227. The flange 227 may, for example, be a conflat flange ("CF") and may have a DN number of DN 160 and may be an ultra-high vacuum ("UHV") flange. With the flange 227, the system 200 may be capable of being held at ultra-high vacuum levels during analysis of a specimen 209.

The detector assembly may further comprise a detector 230 such as a delay-line detector. The detector 230 may be mounted onto the flange 227 which may be bolted onto a side of the TEM column 215 using the mounting element 224. Using the detector 230, an image function may be generated from the specimen 209 during analysis. As field desorption is generated within the TEM objective polepiece 236, the detector 230 may be capable of generating an x, y position and a time of flight ("ToF"). Using the information detected with the detector 230 a sequence may be generated. The ToF may be capable of being used to identify what types of atoms are emitted during the process.

The system 200 may further comprise an output and/or input element 233. The output and/or input element 233 may be used to attach the system 200 to external pumping and/or a gas input for use in various analysis experiments. For example, during APT, the system 200 may be attached to external pumping with element 233 and during field ion microscopy ("FIM") a gas input may be attached.

Figure 3:
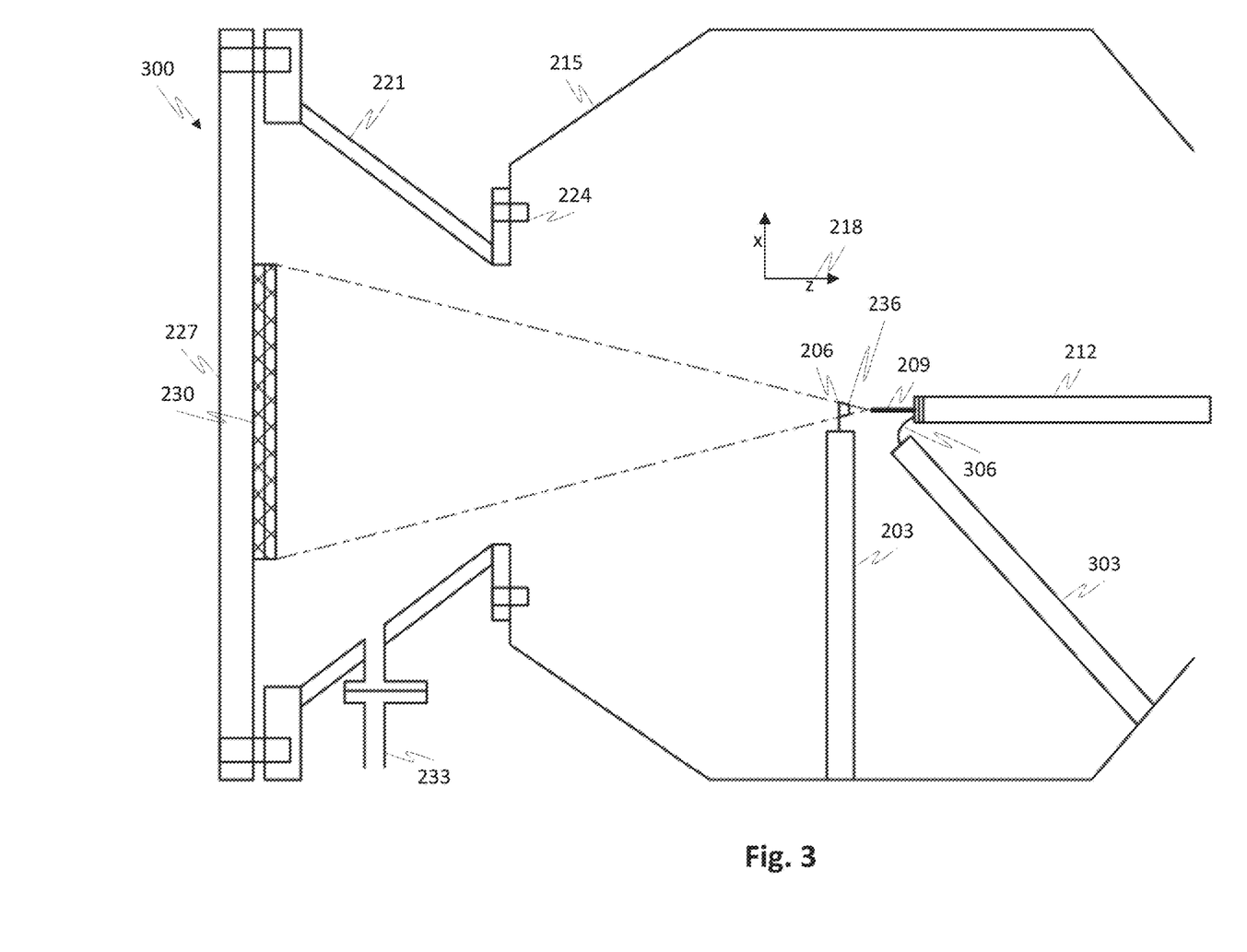
FIG. 3 illustrates an aberration-corrected atom probe tomography system in accordance with one or more of the embodiments described herein.

As illustrated in FIG. 3, an alternative system 300 similar to the system 200 may be created. In the system 300, an arm 303 with a contact 306 at one end may be used to apply a voltage to the specimen 209 as opposed to using the TEM holder 212 to apply the voltage to the specimen.

Using a system 200, 300 as illustrated in FIGS. 2 and 3, a high-resolution image of a specimen 209 may be created. Using a high-resolution TEM image (for example greater than 0.25 nm), 300 as illustrated, any ion aberration may be corrected during the reconstruction process instead of using in-column hardware. In this way, no extra hardware to correct for the aberrations is required during analysis. Here the aberrations may be corrected for through software after gaining the information acquired from the system 200, 300 being used to analyze the specimen.

Normally, atom probe data analysis techniques rely on numerous assumptions about the specimen, what the radius is, how much material has been removed, etc., as discussed above. Such assumptions are rarely if ever correct. On the other hand, by using an electron microscope to look at the specimen during the atom probe experiment, the volume and/or amount of material removed during the experiment may be precisely defined. Using the methods described herein, the specimen volume may be actually quantified to four significant figures.

Once a transfer function, H(u) is generated using the image function and the specimen function generated by the system described herein, all ion aberrations may be measured and thus corrected during reconstruction. In some embodiments, H(u) may be generated by comparing the specimen function and the image function in (for example) Fourier space or using Zernike polynomials. This allows us to compare the real space Specimen function with the image function.

In general, using a delay line detector an x, y position, a time of flight, and also provides an ion evaporation sequence, may be obtained for a specimen. Next, the x and y positions and the sequence may be converted into x, y, z coordinates using information from the TEM. The information from the TEM may be used to define a specimen function, which essentially contains information about the position of atoms within the specimen on an x, y, z coordinate (i.e., lattice positions). Using the specimen function, the closest x, y position for each atom detected by the detector in the image function may be corrected using H(u) and the atoms may be stacked into the lattice positions using software reconstruction methods. With such systems as described herein, exactly where every atom was inside a material may be determined with single atom resolution.

Figure 4:
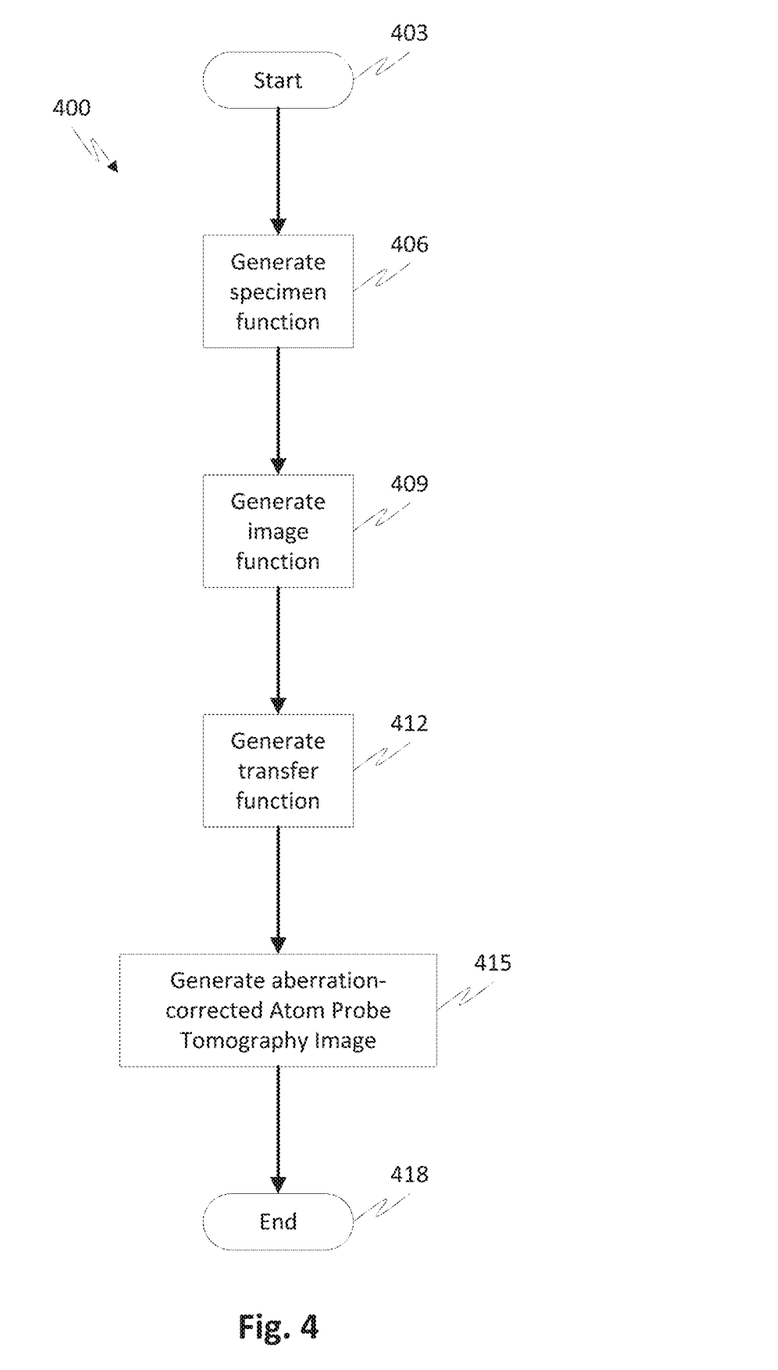
FIG. 4 is a flowchart of a method of generating aberration-corrected atom probe tomography in accordance with one or more of the embodiments described herein.

A method 400 in accordance with one or more embodiments of the present disclosure may be as illustrated in FIG. 4. The method 400 may begin in step 403 by using a system 200, 300 as illustrated in FIGS. 2 and 3 and in step 406, a specimen function associated with a plurality of lattice positions of ions of a specimen in a holder may be generated using a transmission electron microscope of a system 200, 300.

Next, an image function associated with x- and y-coordinates and time of flight information for a plurality of ions of the specimen in the holder may be generated using a delay line detector mounted on the transmission electron microscope as illustrated in FIGS. 2 and 3. In some embodiments, generating the image function may comprise using field desorption within an objective polepiece of the transmission electron microscope.

A transfer function based on the specimen function and the image function may be generated in step 412. The transfer function may comprise information relating to ion trajectory aberrations associated with the specimen analysis.

In step 415, an atom probe tomography (APT) image of the specimen may be generated based on the specimen function, the image function, and the transfer function. The APT image may be adjusted during its generation to correct for the ion trajectory aberrations. The method 400 may end at step 418.

In the detailed description, numerous specific details are set forth in order to provide a thorough understanding of the disclosed techniques. However, it will be understood by those skilled in the art that the present techniques may be practiced without these specific details. In other instances, well-known methods, procedures, components and circuits have not been described in detail so as not to obscure the present disclosure.

Although embodiments are not limited in this regard, discussions utilizing terms such as, for example, "processing," "computing," "calculating," "determining," "establishing", "analysing", "checking", or the like, may refer to operation(s) and/or process(es) of a computer, a computing platform, a computing system, a communication system or subsystem, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

Although embodiments are not limited in this regard, the terms "plurality" and "a plurality" as used herein may include, for example, "multiple" or "two or more". The terms "plurality" or "a plurality" may be used throughout the specification to describe two or more components, devices, elements, units, parameters, circuits, or the like. For example, "a plurality of stations" may include two or more stations.

It may be advantageous to set forth definitions of certain words and phrases used throughout this document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, interconnected with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, circuitry, firmware or software, or some combination of at least two of the same. It should be noted that the functionality associated with any particular controller may be centralized or distributed, whether locally or remotely. Definitions for certain words and phrases are provided throughout this document and those of ordinary skill in the art should understand that in many, if not most instances, such definitions apply to prior, as well as future uses of such defined words and phrases.

For purposes of explanation, numerous details are set forth in order to provide a thorough understanding of the present techniques. It should be appreciated however that the present disclosure may be practiced in a variety of ways beyond the specific details set forth herein.

Exemplary aspects are directed toward:

A method for correcting aberrations in atom probe tomography, the method comprising: generating, using a Transmission Electron Microscope (TEM), a specimen function associated with a plurality of lattice positions of ions of a specimen in a holder; generating, using a delay line detector mounted on the transmission electron microscope, an image function associated with x- and y-coordinates and time of flight information for a plurality of ions of the specimen in the holder; generating a transfer function based on the specimen function and the image function, wherein the transfer function comprises information relating to ion trajectory aberrations; and generating an Atom Probe Tomography (APT) image of the specimen based on the specimen function, the image function, and the transfer function, wherein the APT image is adjusted to correct for the ion trajectory aberrations.

A system for generating aberration-corrected atom probe tomography images, the system comprising: a transmission electron microscope generating a specimen function associated with a plurality of lattice positions of ions of a specimen in a holder; a delay line detector mounted on the transmission electron microscope generating an image function associated with x- and y-coordinates and time of flight information for a plurality of ions of the specimen in the holder; and a processor, wherein the processor generates a transfer function based on the specimen function and the image function, wherein the transfer function comprises information relating to ion trajectory aberrations, wherein the processor generates an Atom Probe Tomography (APT) image of the specimen based on the specimen function, the image function, and the transfer function, and wherein the APT image is adjusted to correct for the ion trajectory aberrations.

An atom probe for generating aberration-corrected atom probe tomography images, the atom probe comprising: a transmission electron microscope generating a specimen function associated with a plurality of lattice positions of ions of a specimen in a holder; a delay line detector mounted on the transmission electron microscope generating an image function associated with x- and y-coordinates and time of flight information for a plurality of ions of the specimen in the holder; and a processor, wherein the processor generates a transfer function based on the specimen function and the image function, wherein the transfer function comprises information relating to ion trajectory aberrations, wherein the processor generates an Atom Probe Tomography (APT) image of the specimen based on the specimen function, the image function, and the transfer function, and wherein the APT image is adjusted to correct for the ion trajectory aberrations.

Any of the above aspects, wherein the holder applies a cryogenic temperature to the specimen.

Any of the above aspects, wherein the holder applies a high voltage to the specimen.

Any of the above aspects, wherein a negative voltage is applied to an ion extraction electrode.

Any of the above aspects, wherein the specimen is a needle-shaped specimen.

Any of the above aspects, wherein generating the image function comprises using field desorption within an objective polepiece of the transmission electron microscope.

Any of the above aspects, wherein the delay line detector is incorporated by an assembly, wherein the assembly enables high-vacuum throughout the transmission electron microscope.

For purposes of explanation, numerous details are set forth in order to provide a thorough understanding of the present embodiments. It should be appreciated however that the techniques herein may be practiced in a variety of ways beyond the specific details set forth herein.

It is therefore apparent that there has at least been provided systems and methods for generating aberration-correct atom probe tomography images. While the embodiments have been described in conjunction with a number of embodiments, it is evident that many alternatives, modifications and variations would be or are apparent to those of ordinary skill in the applicable arts. Accordingly, this disclosure is intended to embrace all such alternatives, modifications, equivalents and variations that are within the spirit and scope of this disclosure.

What is claimed is:

1. A method for correcting aberrations in atom probe tomography, the method comprising:
    generating, using a transmission electron microscope, a specimen function associated with a plurality of lattice positions of ions of a specimen in a holder;
    generating, using a delay line detector mounted on the transmission electron microscope, an image function associated with x- and y-coordinates and time of flight information for a plurality of ions of the specimen in the holder;
    generating a transfer function based on the specimen function and the image function, wherein the transfer function comprises information relating to ion trajectory aberrations; and
    generating an Atom Probe Tomography (APT) image of the specimen based on the specimen function, the image function, and the transfer function, wherein the APT image is adjusted to correct for the ion trajectory aberrations.

2. The method of claim 1, wherein the holder applies a cryogenic temperature to the specimen.

3. The method of claim 1, wherein the holder applies a high voltage to the specimen.

4. The method of claim 3, wherein a negative voltage is applied to a local electrode.

5. The method of claim 1, wherein the specimen is a needle-shaped specimen.

6. The method of claim 1, wherein generating the image function comprises using field desorption within an objective polepiece of the transmission electron microscope.

7. The method of claim 1, wherein the delay line detector is incorporated by an assembly, wherein the assembly enables high-vacuum throughout the transmission electron microscope.

8. The method of claim 1, wherein the specimen function is generated with spatial resolution of around 0.25 nanometers or less.

9. The method of claim 1, wherein generating the specimen function and generating the image function are performed at or near the same time.

10. A system for generating aberration-corrected atom probe tomography images, the system comprising:
    a transmission electron microscope generating a specimen function associated with a plurality of lattice positions of ions of a specimen in a holder;
    a delay line detector mounted on the transmission electron microscope generating an image function associated with x- and y-coordinates and time of flight information for a plurality of ions of the specimen in the holder; and
    a processor, wherein the processor generates a transfer function based on the specimen function and the image function, wherein the transfer function comprises information relating to ion trajectory aberrations, wherein the processor generates an Atom Probe Tomography (APT) image of the specimen based on the specimen function, the image function, and the transfer function, and wherein the APT image is adjusted to correct for the ion trajectory aberrations.

11. The system of claim 10, wherein the holder applies a cryogenic temperature to the specimen.

12. The system of claim 10, wherein the holder applies a high voltage to the specimen.

13. The system of claim 12, wherein a negative voltage is applied to a local electrode.

14. The system of claim 10, wherein the specimen is a needle-shaped specimen.

15. The system of claim 10, wherein generating the image function comprises using field desorption within an objective polepiece of the transmission electron microscope.

16. The system of claim 10, wherein the delay line detector is incorporated by an assembly, wherein the assembly enables high-vacuum throughout the transmission electron microscope.

17. The system of claim 10, wherein the specimen function is generated with spatial resolution of around 0.25 nanometers or less.

18. The system of claim 10, wherein generating the specimen function and generating the image function are performed at or near the same time.

19. An atom probe for generating aberration-corrected atom probe tomography images, the atom probe comprising:
    a transmission electron microscope generating a specimen function associated with a plurality of lattice positions of ions of a specimen in a holder;
    a delay line detector mounted on the transmission electron microscope generating an image function associated with x- and y-coordinates and time of flight information for a plurality of ions of the specimen in the holder; and
    a processor, wherein the processor generates a transfer function based on the specimen function and the image function, wherein the transfer function comprises information relating to ion trajectory aberrations, wherein the processor generates an Atom Probe Tomography (APT) image of the specimen based on the specimen function, the image function, and the transfer function, and wherein the APT image is adjusted to correct for the ion trajectory aberrations.

20. The atom probe of claim 19, wherein the holder applies a cryogenic temperature to the specimen.

\* \* \* \* \*